United States Patent
Arita et al.

(10) Patent No.: US 9,567,227 B2
(45) Date of Patent: Feb. 14, 2017

(54) PROCESS FOR PRODUCING SILICON, SILICON, AND PANEL FOR SOLAR CELLS

(75) Inventors: Yoji Arita, Kanagawa (JP); Takashi Yoneda, Toyama (JP)

(73) Assignee: MITSUBISHI CHEMICAL CORPORATION, Tokyo (JP)

( * ) Notice: Subject to any disclaimer, the term of this patent is extended or adjusted under 35 U.S.C. 154(b) by 249 days.

(21) Appl. No.: 13/342,524

(22) Filed: Jan. 3, 2012

(65) Prior Publication Data

US 2012/0100058 A1    Apr. 26, 2012

Related U.S. Application Data

(63) Continuation of application No. PCT/JP2010/060903, filed on Jun. 25, 2010.

(30) Foreign Application Priority Data

Jul. 3, 2009    (JP) .................................. 2009-159003

(51) Int. Cl.
| | |
|---|---|
| *C01B 33/02* | (2006.01) |
| *C01B 33/037* | (2006.01) |
| *H01L 31/18* | (2006.01) |

(52) U.S. Cl.
CPC ............ *C01B 33/037* (2013.01); *C01B 33/02* (2013.01); *H01L 31/182* (2013.01); *Y02E 10/546* (2013.01); *Y02P 70/521* (2015.11)

(58) Field of Classification Search
CPC ........ C01B 33/02; C01B 33/00; C01B 33/033; C01B 33/037; C01B 33/023; C03B 5/173; C03B 5/18; C03B 5/185; C03B 5/187; C03B 5/183; C03B 5/225; C03B 5/237; H01L 31/18; Y02E 10/546; Y02E 10/52; Y02E 10/547

USPC .......... 423/348–349; 65/134.1, 134.8, 134.5, 65/135.6, 135.3, 134.6, 134.2; 75/10.5
See application file for complete search history.

(56) References Cited

U.S. PATENT DOCUMENTS

| | | | |
|---|---|---|---|
| 4,388,286 A | 6/1983 | Kapur et al. | |
| 4,612,179 A | 9/1986 | Sanjurjo et al. | |
| 2007/0180949 A1 | 8/2007 | Kondo et al. | |
| 2007/0266826 A1* | 11/2007 | Sanjurjo et al. | ............... 75/367 |

FOREIGN PATENT DOCUMENTS

| | | |
|---|---|---|
| EP | 2 072 454 A1 | 6/2009 |
| EP | 2 072 464 A1 | 6/2009 |
| JP | 62-502319 | 9/1987 |
| JP | 04-228414 | 8/1992 |
| JP | 11-049510 | 2/1999 |
| JP | 2005-247623 | 9/2005 |

(Continued)

OTHER PUBLICATIONS

International Search Report issued Sep. 21, 2010 in PCT/JP210/060903 filed Jun. 25, 2010.

(Continued)

*Primary Examiner* — Melvin C Mayes
*Assistant Examiner* — Smita Patel
(74) *Attorney, Agent, or Firm* — Oblon, McClelland, Maier & Neustadt, L.L.P.

(57) ABSTRACT

A process for producing silicon which comprises: bringing molten silicon containing an impurity into contact with molten salt in a vessel to react the impurity contained in the molten silicon with the molten salt; removing the impurity from the system.

18 Claims, 6 Drawing Sheets

(56) References Cited

FOREIGN PATENT DOCUMENTS

| WO | WO 86/05475 | 9/1986 |
| WO | WO 2008/035799 | 3/2008 |

OTHER PUBLICATIONS

Combined Office Action and Search Report issued Aug. 12, 2013 in Chinese Patent Application No. 201080023329.X with English language translation.
Office Action issued on Jun. 10, 2014 in the corresponding Japanese Patent Application No. 2011-520901 (with English Translation).
Office Action (Final Rejection) issued on Jan. 27, 2015 in corresponding Japanese Patent Application No. 2011-520901 with English language translation thereof.

* cited by examiner

PROCESS FOR PRODUCING SILICON, SILICON, AND PANEL FOR SOLAR CELLS

TECHNICAL FIELD

The present invention relates to a process for producing silicon to be used as a material for fabricating, for example, panels for solar cells.

BACKGROUND ART

High-purity metallic silicon having a resistivity of 0.5-1.5 Ω·cm or higher and a purity of 99.9999% (6 N) or higher is generally used for polysilicon solar cells. The most desirable industrial process for producing this high-purity metallic silicon is a process in which raw-material metallic silicon that contains impurities in a large amount and has a low unit price is refined to remove impurities therefrom and thereby produce the high-purity metallic silicon.

Among the impurities contained in raw-material metallic silicon, iron, aluminum, and calcium can be removed by subjecting the molten silicon to solidification/segregation to thereby cause these impurity metals to remain in the liquid phase of the molten silicon. Calcium and the like can be removed by subjecting the molten silicon to a vaporization treatment in a vacuum of about $1.3 \times 10^{-2}$ to $10^{-4}$ Pa ($10^{-4}$ to $10^{-6}$ Torr), although this method requires much time.

However, boron and phosphorus, among the impurities, are exceedingly difficult to remove. Removal of boron is especially difficult. For example, an oxidation treatment is being conducted in which the boron is gasified and removed as a compound thereof with oxygen or hydrogen, for example, by adding oxygen, carbon dioxide, or water vapor to argon as an inert gas and bubbling this mixed gas into the molten silicon (patent document 1 and patent document 2).

The method described above has drawbacks that the operation for oxidizing the boron (B) contained in raw-material metallic silicon using, for example, water vapor and removing the boron as BO gas requires much time, and that silicon oxidation simultaneously occurs, resulting in a large loss. Especially when water vapor is blown into the molten silicon, a side reaction occurs to evolve hydrogen in a large amount. There has hence been a problem concerning safety.

There also is a method in which silicon prepared by melting raw-material metallic silicon is subjected to a vaporization treatment in a vacuum of about $1.3 \times 10^{-2}$ to $10^{-4}$ Pa ($10^{-4}$ to $10^{-6}$ Torr) in order to remove phosphorus. However, this method has had a problem that the treatment requires much time and is costly because the treatment is a high-vacuum process. Namely, there has been a problem that the boron and phosphorus to be removed must be removed by respective separate processes which are costly.

Meanwhile, as a method for refining silicon using an alkali halide, a technique has been proposed in which slag is formed from sludge of raw-material metallic silicon (the slag includes, as a main component, silicon dioxide which was present in the raw-material metallic silicon) and the slag is used for compositional regulation during impurity removal to recover the silicon (patent document 3). However, silicon having an entirely satisfactory purity has not been obtained.

Furthermore, patent document 4 describes a step in which 20 g of a raw-material metallic silicon powder is pulverized and mixed, in a weight ratio of 1:1, with NaF having the same particle diameter as the silicon powder, a step in which the powder mixture is heated at 1,300° C. and the solid silicon is brought into contact with the molten NaF, a step in which a second sample is heated at 1,450° C. for 10 minutes to melt the NaF and the raw-material metallic silicon, a step in which these samples (NaF and silicon) are cooled to room temperature, and a step in which the silicon is separated from the NaF contained in each sample by extraction with an aqueous medium and by succeeding decantation and filtration.

However, the process described in patent document 4 is a mere technique for silicon refining in which silicon is separated from solid matter containing NaF and raw-material metallic silicon by means of filtration, etc. to thereby refine the silicon. The process has had problems that the refining effect is insufficient and that the operation for separating silicon is not easy.

Prior-Art Documents

Patent Documents

Patent Document 1: JP-A-11-49510
Patent Document 2: JP-A-4-228414
Patent Document 3: U.S. Pat. No. 4,388,286
Patent Document 4: JP-A-62-502319

SUMMARY OF THE INVENTION

Problems that the Invention is to Solve

An object of the invention is to eliminate the problems of prior-art techniques described above and to provide a process for silicon production with which it is possible to obtain high-purity metallic silicon from raw-material metallic silicon by efficiently and simultaneously removing impurities such as boron (B), phosphorus (P), iron (Fe), aluminum (Al), and titanium (Ti) from the raw material in a short period by the same process.

Means for Solving the Problems

The present invention made various investigations in order to overcome those problems. As a result, it has been found that by melting raw-material metallic silicon and bringing the molten silicon (hereinafter referred to also as "molten silicon containing impurity") into contact with a molten salt in a vessel to react the impurity, such as boron (B) and phosphorus (P), contained in the molten silicon with the molten salt, volatile compounds containing the impurity can be dissolved in the molten salt or be vaporized off into the gas phase and the impurity can be thus removed from the system. The invention has been accomplished based on these findings.

Essential points of the invention reside in the following (1) to (16).
(1) A process for producing silicon, which comprises: bringing molten silicon containing an impurity into contact with molten salt in a vessel to react the impurity contained in the molten silicon with the molten salt; and removing the impurity from the system.
(2) The process for producing silicon according to (1) above, wherein the step of removing the impurity from the system is a step in which a reaction product obtained by reacting the impurity contained in the molten silicon with the molten salt is vaporized and removed.
(3) The process for producing silicon according to (1) or (2) above, wherein the step of removing the impurity from the system is a step in which the impurity contained in the molten silicon is removed from the system by evacuation.

(4) The process for producing silicon according to any one of (1) to (3) above, wherein the step of removing the impurity from the system is a step in which the impurity contained in the molten silicon is removed from the system together with a carrier gas.

(5) The process for producing silicon according to any one of (1) to (4) above, wherein a lid for controlling the rate of vaporization of the molten salt or of the reaction product obtained by reacting the impurity contained in the molten silicon with the molten salt is disposed at an inner part or upper part of the vessel.

(6) The process for producing silicon according to any one of (1) to (5) above, wherein the reaction between the impurity contained in the molten silicon and the molten salt is conducted by forming an interface between the liquid phase of the molten silicon and the liquid phase of the molten salt.

(7) The process for producing silicon according to any one of (1) to (6) above, wherein the impurity contained in the molten silicon at least includes boron.

(8) The process for producing silicon according to any one of (1) to (7) above, wherein the molten salt comprises at least one compound selected from the group consisting of halide salts of alkali metals, halide salts of alkaline earth metals, composite salts containing an alkali metal and a halogen, and composite salts containing an alkaline earth metal and a halogen.

(9) The process for producing silicon according to any one of (1) to (8) above, wherein the molten salt comprises at least one compound selected from the group consisting of sodium fluoride (NaF), sodium silicofluoride ($Na_2SiF_6$), cryolite ($Na_3AlF_6$), mixtures of sodium fluoride and barium fluoride, and mixtures of sodium fluoride, barium fluoride, and barium chloride.

(10) The process for producing silicon according to any one of (1) to (9) above, wherein the amount of the molten salt is 5-300% by weight based on the molten silicon.

(11) The process for producing silicon according to any one of (1) to (10) above, wherein the impurity contained in the molten silicon are reacted with the molten salt while causing the molten silicon to flow by any one of the following methods (i) to (iv):

(i) a method of blowing an inert gas into the molten silicon, (ii) a method of inductively stirring the molten silicon by using a high-frequency induction furnace, (iii) a method of mechanically forcing the molten salt of an upper layer into the molten silicon of a lower layer, (iv) a method of stirring the molten silicon by using a rotor.

(12) The process for producing silicon according to any one of (1) to (11) above, wherein the molten salt is continuously added to the molten silicon and the step of removing the impurity from the system is conducted by a continuous suction removal.

(13) The process for producing silicon according to any one of (1) to (12) above, wherein after the step of removing the impurity from the system, molten salt is added to the molten silicon again and the step is conducted again.

(14) The process for producing silicon according to any one of (1) to (13) above, wherein substances removed by the step of removing the impurity from the system are recovered to purify molten salt, and the purified molten salt is used again as molten salt.

(15) Silicon obtained by the process for production according to any one of (1) to (14) above, which at least has a boron content of 1.4 ppm or less.

(16) A panel for solar cells, comprising the silicon according to (15) above.

EFFECTS OF THE INVENTION

According to the invention, by bringing molten silicon containing impurity such as boron (B) and phosphorus (P) into contact with a molten salt in a vessel, an interface can be formed between the liquid phase of the molten silicon and the liquid phase of the molten salt having a temperature not lower than the melting point thereof (hereinafter referred to also as "molten-salt liquid phase") and the impurity contained in the molten silicon can be reacted with the molten salt through the interface.

By reacting the impurity contained in the molten silicon with the molten salt through the interface between the molten silicon and the molten salt, the impurity is dissolved in the molten salt. Alternatively, by reacting the impurity contained in the molten silicon with the molten salt through the interface between the molten silicon and the molten salt, reaction products yielded by the reaction are dissolved in the molten salt or the reaction products which are compounds having a high vapor pressure (hereinafter referred to also as "impurity-containing compounds") are vaporized together with the molten salt. Thus, the impurity can be efficiently removed from the molten silicon. The impurity-containing compounds dissolved in the molten salt can be removed from the system together with the molten salt by vaporizing and removing the molten salt.

In the step of bringing the molten salt into contact with the molten silicon, the alkali metal or alkaline earth metal which is present in a slight amount in the molten salt is incorporated into the molten silicon. However, the alkali metal or alkaline earth metal can be easily removed by later processes, e.g., unidirectional solidification and vacuum heating.

Thus, the process for silicon production of the invention can be used to efficiently remove impurities such as boron (B) and phosphorus (P) from raw-material metallic silicon. According to the process for silicon production of the invention, high-purity metallic silicon having a high purity of level 6 N or above can be rapidly obtained at low cost. The process hence has a high industrial value.

MODES FOR CARRYING OUT THE INVENTION

Figure 1:
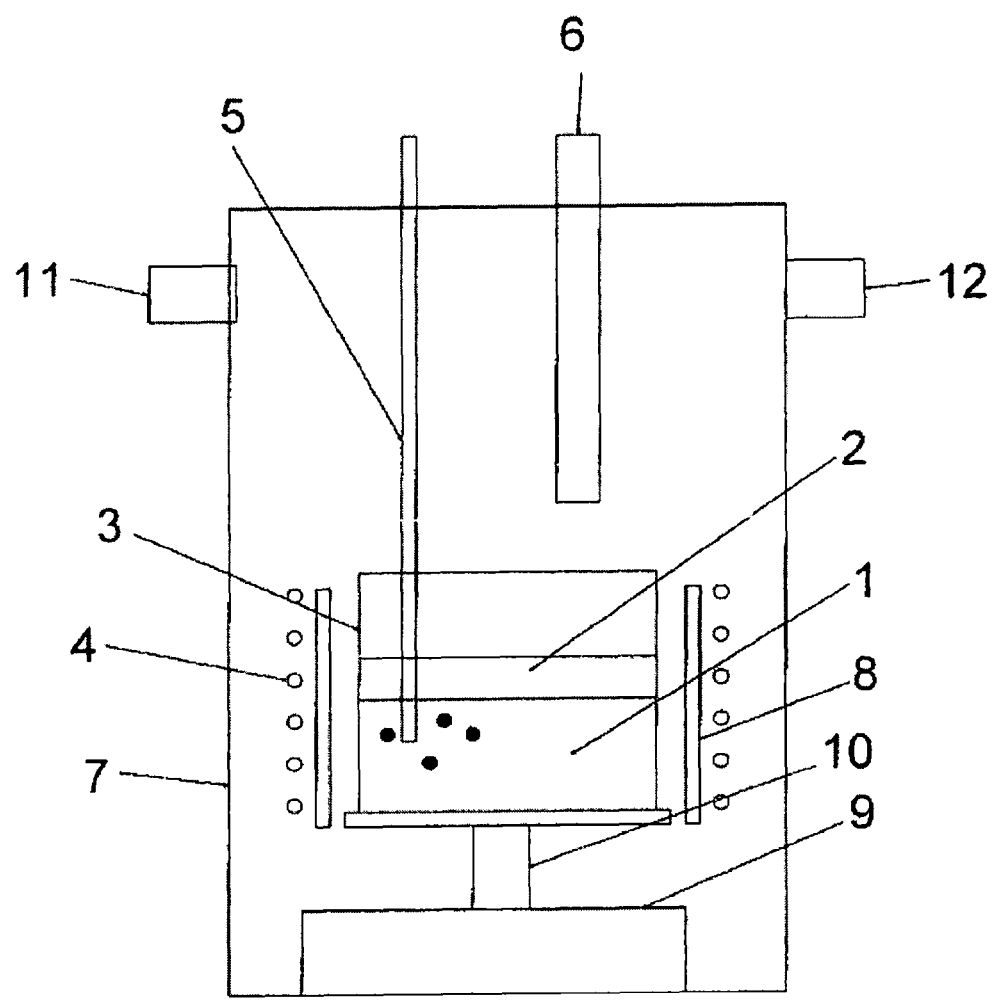
FIG. 1 is a diagrammatic sectional view diagrammatically illustrating one example of high-purity silicon production apparatus usable in the invention.

Modes for carrying out the invention will be explained below in detail. The following explanations on constituent elements are for embodiments (representative embodiments) of the invention, and the invention should not be construed as being limited to the embodiments unless the invention departs from the spirit thereof.

The process for silicon production of the invention is characterized by including steps in which molten silicon obtained by melting raw-material metallic silicon containing one or more impurities is brought into contact with molten salt in a vessel to react the impurity contained in the molten silicon with the molten salt and the impurity is removed from the system (hereinafter referred to also as "removal step").

By bringing molten silicon containing impurity into contact with a molten salt in a vessel (crucible), an interface can be formed between the liquid phase of the molten silicon and the liquid phase of the molten salt and the impurity contained in the molten silicon can be reacted with the molten salt.

By reacting the impurity contained in the molten silicon with the molten salt, reaction products yielded by the reaction are dissolved in the molten salt or the reaction products which are compounds having a high vapor pressure are vaporized together with the molten salt. Thus, the impurity can be removed from the molten silicon.

Furthermore, since the molten salt added can also be vaporized and removed, refined silicon only can be recovered.

In the invention, the raw-material metallic silicon is silicon which contains, for example, boron (B), phosphorus (P), iron (Fe), aluminum (Al), titanium (Ti), and the like as impurities.

The process of the invention is especially suitable for removing boron (B) and phosphorus (P) among those impurities.

The total concentration of the impurity in the raw-material metallic silicon is usually preferably 10-50 ppm, more preferably about 10-30 ppm, by mass. The lower the total concentration of the impurity in the raw-material metallic silicon, the more the raw material is preferred. However, raw-material metallic silicon containing impurities in a concentration within that range is a preferred raw material because this silicon can be obtained by ordinary arc carbon reduction and hence has a low cost.

The molten salt is not particularly limited so long as the salt is a compound that melts at the temperature at which the raw-material metallic silicon is kept molten and that reacts with impurities contained in the molten silicon, e.g., boron and phosphorus, upon formation of an interface between the liquid phase of the molten silicon and the liquid phase of the molten salt, thereby enables the impurity to vaporize off into the gas phase or dissolve in the molten salt, and is capable of being vaporized and removed together with the impurity.

Examples of the molten salt include: halide salts of alkali metals, such as sodium fluoride (NaF), potassium fluoride (KF), sodium chloride (NaCl), and potassium chloride (KCl); halide salts of alkaline earth metals, such as calcium fluoride ($CaF_2$), barium fluoride ($BaF_2$), calcium chloride ($CaCl_2$), and barium chloride ($BaCl_2$); composite salts containing an alkali metal and a halogen, such as sodium silicofluoride ($Na_2SiF_6$), cryolite ($Na_3AlF_6$), chiolite ($Na_5Al_3F_{14}$), $KAlCl_4$, and $NaAlCl_4$; and composite salts containing an alkaline earth metal and a halogen, such as $BaCaCl_4$ and $MgCaF_4$. Preferred of these are the salts which contain fluorine as the halogen.

Among those salts, sodium silicofluoride ($Na_2SiF_6$) is a composite salt of sodium fluoride (NaF) and silicon fluoride ($SiF_4$), while cryolite ($Na_3AlF_6$) is a composite salt of sodium fluoride (NaF) and aluminum fluoride ($AlF_3$).

Suitable examples among those include sodium fluoride (NaF), sodium silicofluoride ($Na_2SiF_6$), cryolite ($Na_3AlF_6$), mixtures of sodium fluoride and barium fluoride, and mixtures of sodium fluoride, barium fluoride, and barium chloride.

In particular, sodium silicofluoride ($Na_2SiF_6$) decomposes to generate $SiF_4$ (gas) and react with the impurity, and this results in no silicon loss. Consequently, sodium silicofluoride ($Na_2SiF_6$) is especially preferred.

Suitable examples further include potassium fluoride (KF), potassium cryolite ($K_3AlF_6$), and a compound of potassium fluoride and calcium fluoride (molar ratio, 1:1).

In general, the cryolite ($Na_3AlF_6$) for use in electrolytic refining of aluminum is easily available at low cost and is easy to use industrially.

In the case where the liquid phase of a molten salt is to be formed over the liquid phase of molten silicon, it is preferred to use a molten salt having a lower density than silicon (Si). Examples of this molten salt include the halide salts of alkali metals.

In the case where the liquid phase of a molten salt is to be formed under the liquid phase of molten silicon, it is preferred to use a molten salt having a higher density than silicon. Examples of this molten salt include the halide salts of alkaline earth metals.

It is desirable that the molten salt should have a lower impurity content. However, the impurity also has been halogenated in many cases and mostly vaporize at the treatment temperature. The impurity hence poses no problem. It is therefore possible to use an ordinary industrial chemical as the molten salt.

In the case where a mixture of sodium fluoride and one or more other molten salts is used as molten salts, the amount of the sodium fluoride to be used, based on the amount (total amount) of the other molten salts, is usually preferably 5% by weight or more, more preferably 10% by weight or more, especially preferably 20% by weight or more, and is usually preferably 300% by weight or less, more preferably 100% by weight or less, especially preferably 50% by weight or less.

The amount of the molten salt to be used, based on the starting-material metallic silicon, is usually preferably 5% by weight or more, more preferably 10% by weight or more, even more preferably 20% by weight or more, especially preferably 30% by weight or more, and is usually preferably 300% by weight or less, more preferably 100% by weight or less, especially preferably 50% by weight or less.

By regulating the amount of the molten salt to 5% by weight or more, a sufficient refining effect is obtained. By regulating the amount of the molten salt to 300% by weight or less, the molten salt can be prevented from reacting also with the silicon (Si) and thereby lowering the yield of silicon (Si).

Raw-material metallic silicon and a salt to be melted may be mixed with each other and then simultaneously heated and melted. Alternatively, use may be made of a method in which raw-material metallic silicon only is heated and melted before a salt to be melted is added thereto. Furthermore, it is possible to use fluxed salts prepared by optionally mixing salts to be melted, heating and melting the salts, and then cooling the melt.

The temperature at which raw-material metallic silicon and a salt to be melted are heated and melted preferably is not lower than the melting point of silicon (1,410° C.), and is more preferably 1,450° C. or higher. The upper limit of the temperature is usually preferably 2,400° C. or lower, more preferably 2,000° C. or lower.

Thus, the molten silicon obtained by melting raw-material metallic silicon is brought into contact with a molten salt, and an interface can be thereby formed between the liquid phase of the molten silicon and the liquid phase of the molten salt.

Impurities contained in the molten silicon can be reacted with the molten salt through the interface between the liquid phase of the molten silicon and the liquid phase of the molten salt. As a result, the impurity can be vaporized off into the gas phase or moved to the molten salt.

Furthermore, the gas formed by vaporization of the molten salt, the gas of a decomposition product formed by partial decomposition of a composite compound, or the like can be caused to act on the molten silicon through the interface between the liquid phase of the molten silicon and the liquid phase of the molten salt. Impurities contained in the molten silicon can be thereby reacted with the molten salt.

The reaction time, i.e., the period of contact between the molten silicon and molten salt, is usually preferably 0.1 hour or longer, more preferably 0.25 hours or longer, especially preferably 0.5 hours or longer, and is usually preferably 3 hours or shorter, more preferably 2 hours or shorter, even more preferably 1 hour or shorter.

The longer the reaction time, the higher the effect of diminishing the impurity. However, shorter reaction times are desirable from the standpoint of process cost.

It is preferred that the impurity-containing compounds yielded by forming the interface as described above, i.e., reaction products formed by reacting impurities contained in the molten silicon with the molten salt, should be removed by vaporizing the compounds together with the molten salt (removal by vaporization).

The pressure (degree of vacuum) during the removal by vaporization is usually preferably atmospheric pressure. In some cases, it is preferred to reduce the pressure to about $10^{-4}$ Pa. When the specific gravity of the molten salt is smaller than the specific gravity of the molten silicon and the liquid phase of the molten salt has been formed over the liquid phase of the molten silicon, then it is generally preferred that the pressure should be atmospheric pressure.

It is preferred that during the removal by vaporization, an inert gas such as argon should be passed as a carrier gas through the vessel, because the removal by vaporization is accelerated thereby.

Use may be made of a method in which the molten-salt liquid phase containing impurities that overlies the molten-silicon liquid phase is partly removed mechanically and the removal by vaporization is restarted thereafter, in order to accelerate the removal by vaporization.

In the case where the impurity concentration of the molten silicon has decreased to a desired value as a result of the impurity removal by reacting the impurity contained in the molten silicon with the molten salt, the silicon only may be recovered from a middle part or the bottom of the vessel.

Use may also be made of a method in which the vessel containing the molten silicon and molten salt that have been melted by heating is tilted to transfer the contents to another vessel and this vessel is allowed to stand. As a result, the molten silicon and the molten salt separate into respective two phases. Consequently, the two phases in this state are cooled and solidified, and the silicon is then recovered. In this case, when the recovered silicon contains the molten salt, it is preferred that the molten salt is removed by vaporization later.

When the specific gravity of the molten salt is larger than the specific gravity of silicon and the liquid phase of the molten salt has been formed under the liquid phase of the molten silicon, the reaction may be conducted in the following manner. Since the halide salt of an alkaline earth metal, which has a large specific gravity, has a low vapor pressure, this molten salt is vaporized by reducing the pressure to about 100 Pa and the molten silicon can be bubbled therewith. Thus, the reaction can be accelerated.

It is preferred that the temperature of the molten-silicon liquid phase and molten-salt liquid phase during the vacuum removal should be in the same range as the temperature at which raw-material metallic silicon and a salt to be melted are heated and melted.

By forming a flow of the molten silicon at the interface between the molten-silicon liquid phase and the molten-salt liquid phase, for example, by any one method selected from the following (i) to (vi), not only the reaction between the impurity and the molten salt can be accelerated but also compounds of the impurity, which are products of the reaction between the impurity and the molten salt, can be more efficiently removed.

To form a flow of the molten silicon preferably means to reduce the relative thickness of the boundary layer, which functions as a reaction field formed in the vicinity of the interface between the molten-silicon liquid phase and the molten-salt liquid phase. By forming the flow, the reaction between the impurity and the molten salt can be more efficiently accelerated.

(i) A method in which an inert gas is blown into the molten-silicon liquid phase.
(ii) A method in which a high-frequency induction furnace is used to inductively stir the molten-silicon liquid phase.
(iii) A method in which the molten salt of an upper layer is mechanically forced into the molten-silicon layer of a lower layer. The term "the molten salt is mechanically forced into the molten-silicon layer" means that a mechanical means, e.g., a concave jig made of graphite, is used to force the overlying molten salt into the underlying molten-silicon layer.
(iv) A method in which a rotor is used to stir the liquid phase.
(v) A method in which a powder of the molten salt is blown into the molten-silicon liquid phase together with an inert gas.
(vi) A method in which in a configuration including molten silicon as a lower layer and a molten salt as an upper layer, the surface of the molten silicon is caused, by inductive stirring, to flow radially from the center of the vessel toward the periphery thereof and the surface-layer part of the molten salt is caused, by means of a rotating plate, to flow radially from the center of the vessel toward the periphery thereof. According to this method, the part of the molten salt which is present at the boundary between the molten silicon and the molten salt can be caused to flow from the periphery of the vessel toward the center thereof, and the molten-silicon liquid phase and the molten-salt liquid phase can be caused to flow in opposite directions at the interface therebetween.

After the impurity has been removed by vaporization together with the molten salt, the vessel may be evacuated according to need to thereby remove the residual molten salt, before the molten silicon is solidified. Thus, high-purity silicon can be obtained. Use may also be made of a method in which when the molten silicon is solidified, so-called unidirectional solidification is conducted to remove the residual molten salt and impurities by segregation. Thus, silicon having a higher purity can be obtained.

After the impurity has been removed by any of those methods, the silicon may be further subjected to removal of alkali metals and alkaline earth metals therefrom. Thus, silicon having an even higher purity can be obtained.

The removal of alkali metals and alkaline earth metals can be conducted by a common method which itself is known. Examples thereof include: a unidirectional solidification method; a method in which either an inert carrier gas or a gas obtained by adding oxygen, carbon dioxide, or water vapor to an inert carrier gas is brought into contact with the surface of the molten-silicon liquid phase; a method in which the gas is blown into the molten-silicon liquid phase; and a method in which the alkali metals and the alkaline earth metals are vaporized and removed under high vacuum.

As the carrier gas, use can be made of an inert gas such as, for example, argon. However, the carrier gas should not be construed as being limited to argon, so long as the desired silicon is obtained.

The process of the invention can be carried out using a silicon refining apparatus which includes a vessel for melting therein raw-material metallic silicon and a salt to be melted and in which the vessel can be filled with an inert gas atmosphere, e.g., argon, while being kept in a reduced-pressure state or atmospheric-pressure state.

It is preferred that the apparatus for use in the process for high-purity silicon production of the invention should include: a vessel which can be brought into a high-vacuum state and can also be closely filled with an inert gas atmosphere, e.g., argon; a crucible disposed in the vessel; a coil for heating the crucible by high-frequency heating or a heater which is capable of heating the crucible by resistance heating; and a power supply for these.

It is also preferred that the apparatus should further include: a device for stirring the contents of the crucible with a graphite blade or for blowing argon gas into the molten silicon; and a device for introducing a salt to be melted, raw-material metallic silicon, etc.

In the case where vaporization of the molten salt will occur in a large amount, it is preferred to suitably dispose a bag filter or the like for trapping the vapor.

In the case where the molten salt used has a high vapor pressure, it is preferred to dispose an inner lid within the vessel or dispose a lid at the opening of the vessel to thereby inhibit vaporization of the molten salt, prolong the period of reaction with the molten silicon, and reduce the amount of the molten salt to be used.

Embodiments of the process of the invention will be explained below in detail together with the effects thereof, etc.

(a) With respect to the case where sodium fluoride (NaF) is used as molten salt:

Sodium fluoride (NaF) has a specific gravity at 1,500° C. of about 1.8, which is smaller than the specific gravity of about 2.6 for molten silicon. Consequently, in the crucible, an interface is formed between the molten-silicon liquid phase as a lower layer and the NaF liquid phase as an upper layer.

It is thought that the following reaction occurs through the interface. The boron (B) contained as an impurity in the molten silicon is converted to the reaction product, which, when generated in a slight amount, moves into and dissolves in the molten salt or vaporizes off into the gas phase.

$$4NaF+B=3Na+NaBF_4$$

or $$3NaF+B=3Na+BF_3$$

With respect to the aluminum (Al) contained as an impurity in the molten silicon also, it is thought that the following reaction occurs. As in the case of the boron, the reaction product moves into the molten salt or vaporizes off into the gas phase.

$$Al+6NaF=Na_3AlF_6+3Na$$

For causing the reactions to proceed rapidly, it is important to rapidly remove the products of the reactions. It is preferred that the removal of the reaction products should be conducted by sucking the reaction products from the crucible together with a carrier gas, e.g., argon, to thereby remove the reaction products from the system.

For example, it is preferred to use a method in which a molten salt is suitably continuously added to molten silicon and the products of the reactions are removed by continuous suction. By using this method, the amount of the molten salt to be use can be minimized and the refining can be carried out in a short period.

After the removal step, a molten salt may be added again to conduct a removal step again. Thus, the purity of the silicon can be improved.

The molten salt removed in the removal step can be recovered, purified by a known method, and then reused as a molten salt.

Details of reactions of phosphorus (P) as an impurity are unclear. It is, however, thought that a fluoride or composite fluoride of phosphorus (P) generates at the interface and this reaction product shows the same behavior as the boron (B).

Through those reactions, the metallic sodium is incorporated into the molten silicon. However, the metallic sodium mostly vaporizes off during the process.

The $NaBF_4$, $BF_3$, and the like are thought to first dissolve in the NaF. However, these compounds also have a high vapor pressure and mostly vaporize off during the process. Even if such impurities remain dissolved in the NaF, these impurities can be removed together with the NaF as the molten salt in the latter half of the process by vaporizing the NaF at an elevated temperature or under vacuum.

Other impurities including phosphorus (P), iron (Fe), aluminum (Al), and titanium (Ti) also are removed from the molten silicon by the same process.

There is a possibility that the NaF might react with the Si to yield $SiF_4$ and the gaseous $SiF_4$ might react with impurities. In any case, the impurity can be removed as fluoride compounds having a high vapor pressure.

(b) With respect to the case where composite compound of NaF and $SiF_4$ ($Na_2SiF_6$) is used as molten salt:

It is also possible to use, for example, a composite compound of NaF and $SiF_4$ ($Na_2SiF_6$) from the beginning. In this case, the $Na_2SiF_6$, before becoming a liquid phase, partly decomposes into NaF and $SiF_4$.

Since $SiF_4$ is a gas, it is favorable to mechanically force the $Na_2SiF_6$ into the Si melt because the gas reacts with impurities contained in the melt. There also is an advantage that the NaF is inhibited from reacting with the molten-silicon liquid phase (Si) and, hence, the yield of refined silicon is improved.

(c) With respect to the case where salt mixture of NaF and $BaF_2$ is used as molten salts:

Furthermore, it is possible to use, for example, a salt mixture of NaF and $BaF_2$ as molten salts and dispose these molten salts under molten silicon. So long as the $NaF/BaF_2$ salt mixture has a $BaF_2$ content of 40% by mole or higher, this salt mixture has a higher specific gravity than liquid silicon, which has a specific gravity of about 2.6, and sinks beneath the liquid silicon. It is thought that when the pressure of the atmosphere in the system in this state is reduced, the NaF itself vaporizes and the gas can be bubbled into the liquid silicon to accelerate the reactions.

It is preferred that those reactions should be conducted usually at 0.5-2 atm. In the case where the molten salts are to be removed completely, it is preferred to vaporize the molten salts at a vacuum of about 130 to $13 \times 10^{-3}$ Pa (1 to $10^{-5}$ Torr). As a result, the silicon remains as the only melt, and it becomes possible to easily recover the silicon by pouring the silicon into a casting mold.

Next, modes suitable for carrying out the invention are explained on the basis of the production apparatus shown in the drawings.

FIG. 1 is a sectional view diagrammatically illustrating one example of high-purity metallic silicon production apparatus usable in the invention. This apparatus is configured of a closable chamber 7, a crucible 3 disposed inside the chamber, a coil 4 for induction heating, a heat insulator 8, a support 10 for the crucible, a casting mold 9 for silicon casting, etc. Raw-material metallic silicon 1 and a molten salt 2 are placed in the crucible 3 in the state of having been separated into respective liquid phases.

The closable chamber 7 has, attached thereto, a gas introduction port 11, a gas discharge port 12, a feed material charging port 6, etc., and the internal pressure of the chamber 7 can be regulated in the range of about 0.01 to $2 \times 10^5$ Pa (from vacuum to 2 atm).

The induction coil 4 for heating, the heat insulator 8, and the crucible 3 have been configured so as to be capable of being tilted in an integrated manner. The raw-material metallic silicon 1 which has undergone the treatment is poured into the casting mold 9.

In this apparatus, to stir the interface between the two liquid phases is advantageous for the impurity treatment. By blowing an inert gas, e.g., argon, into the liquid phases through a pipe 5, the liquid phases can be stirred and the state of contact at the interface between the two liquid phases can be improved.

Figure 2:
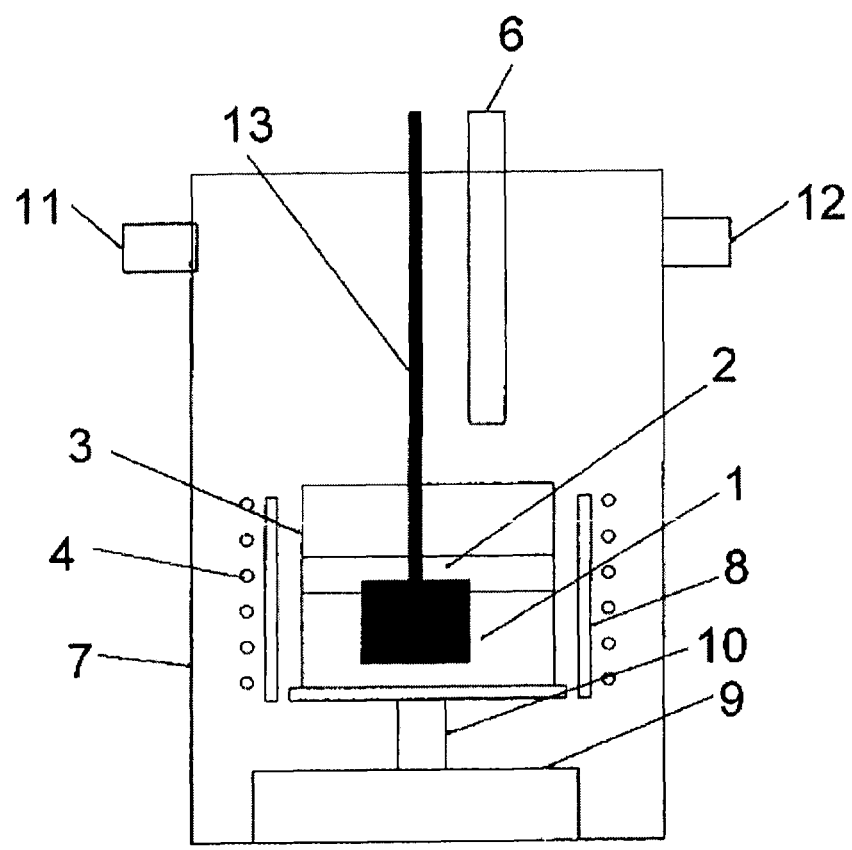
FIG. 2 is a diagrammatic sectional view diagrammatically illustrating another example of high-purity silicon production apparatus usable in the invention.

FIG. 2 is a sectional view diagrammatically illustrating another example of high-purity silicon production apparatus usable in the invention. In FIG. 2, a technique for stirring the liquid phases using a stirring plate 13 is described in place of gas blowing. However, the other parts are substantially the same as in FIG. 1.

Figure 3:
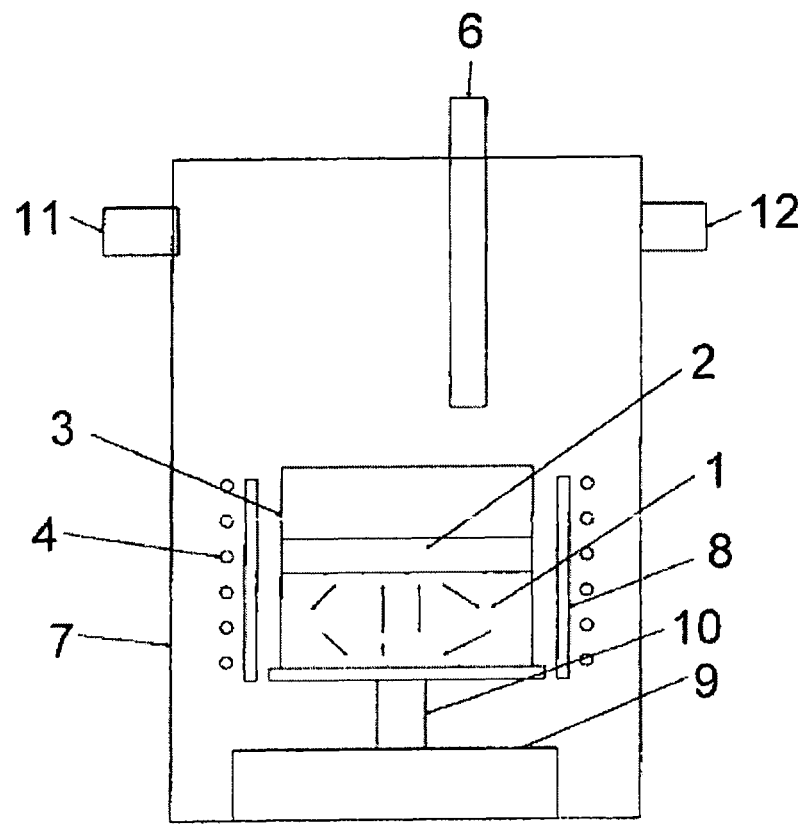
FIG. 3 is a diagrammatic sectional view diagrammatically illustrating still another example of high-purity silicon production apparatus usable in the invention.

FIG. 3 is a sectional view diagrammatically illustrating still another example of high-purity silicon production apparatus usable in the invention. In FIG. 3, a technique for inductively stirring the liquid phase of silicon using a high-frequency induction furnace is described in place of gas blowing. However, the other parts are substantially the same as in FIG. 1.

In the case of induction heating, use of a power supply having a relatively low frequency, e.g., about 1-5 kHz, is desirable because an induced current occurs within the silicon melt and this results in a peculiar stirring phenomenon. In particular, since the silicon melt can be stirred without requiring insertion of a stirring plate or the like into the melt, that technique is preferred also from the standpoint of contamination.

Figure 4:
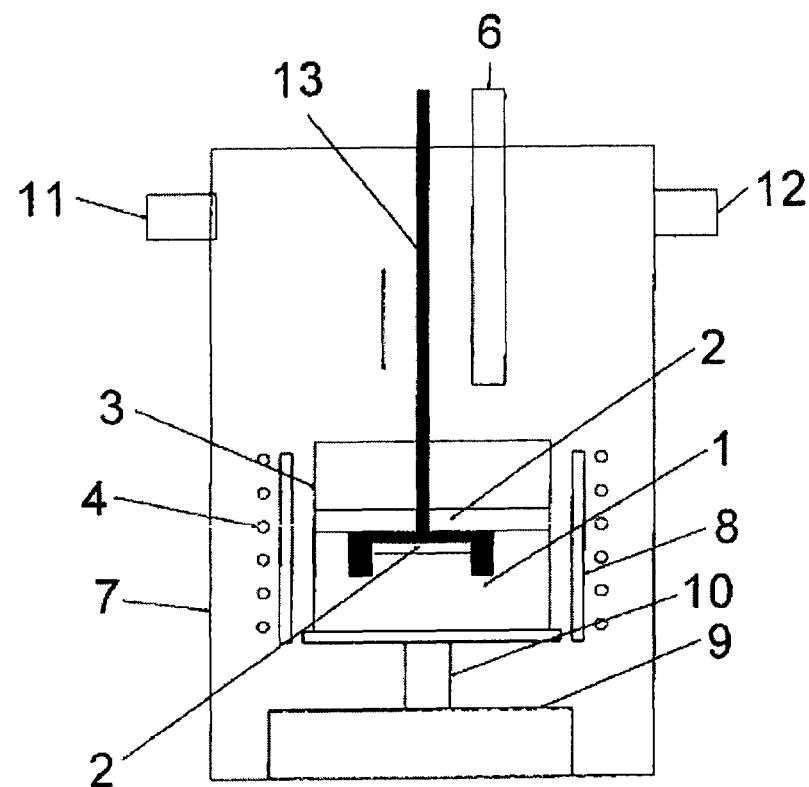
FIG. 4 is a diagrammatic sectional view diagrammatically illustrating a further example of high-purity silicon production apparatus usable in the invention.

FIG. 4 is a sectional view diagrammatically illustrating a further example of high-purity silicon production apparatus usable in the invention. In FIG. 4, in place of gas blowing, a technique is described in which a concave jig 13 made of graphite is used to mechanically force the molten salt as an upper layer into the molten silicon layer as a lower layer to stir the molten silicon layer by means of the gas evolved by vaporization of the molten salt. However, the other parts are substantially the same as in FIG. 1.

Figure 5:
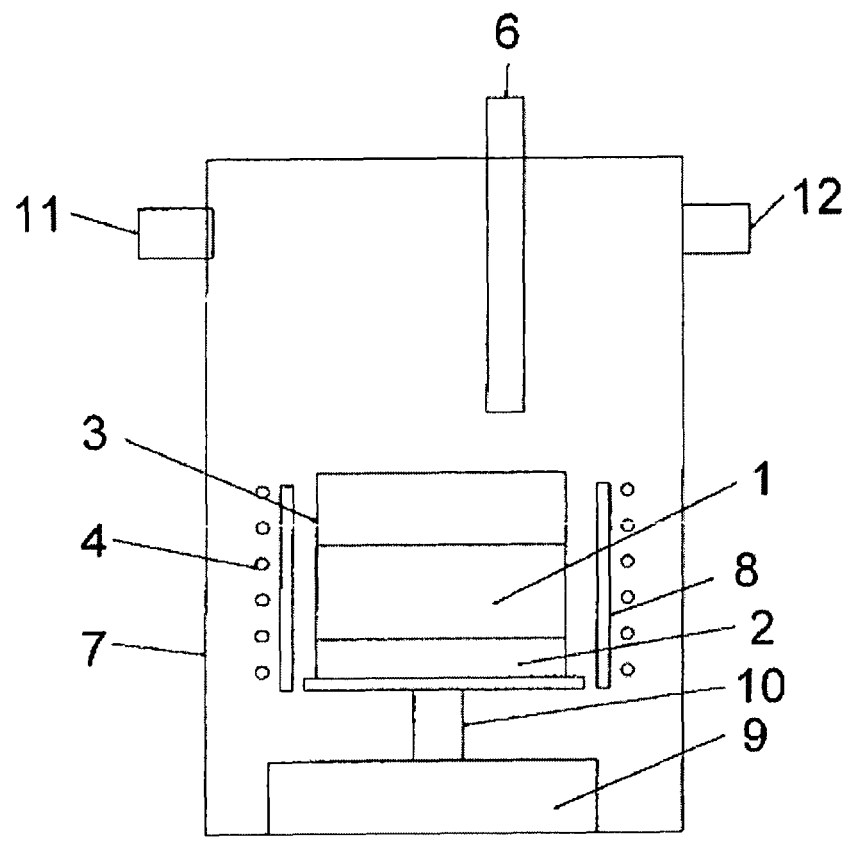
FIG. 5 is a diagrammatic sectional view diagrammatically illustrating still a further example of high-purity silicon production apparatus usable in the invention.

FIG. 5 is a sectional view diagrammatically illustrating still a further example of high-purity silicon production apparatus usable in the invention. In FIG. 5, an embodiment is described in which a molten salt 2 which has a large specific gravity underlies the molten silicon obtained by melting starting-material metallic silicon 1. However, the other parts are substantially the same as in any of FIGS. 1 to 4.

Figure 6:
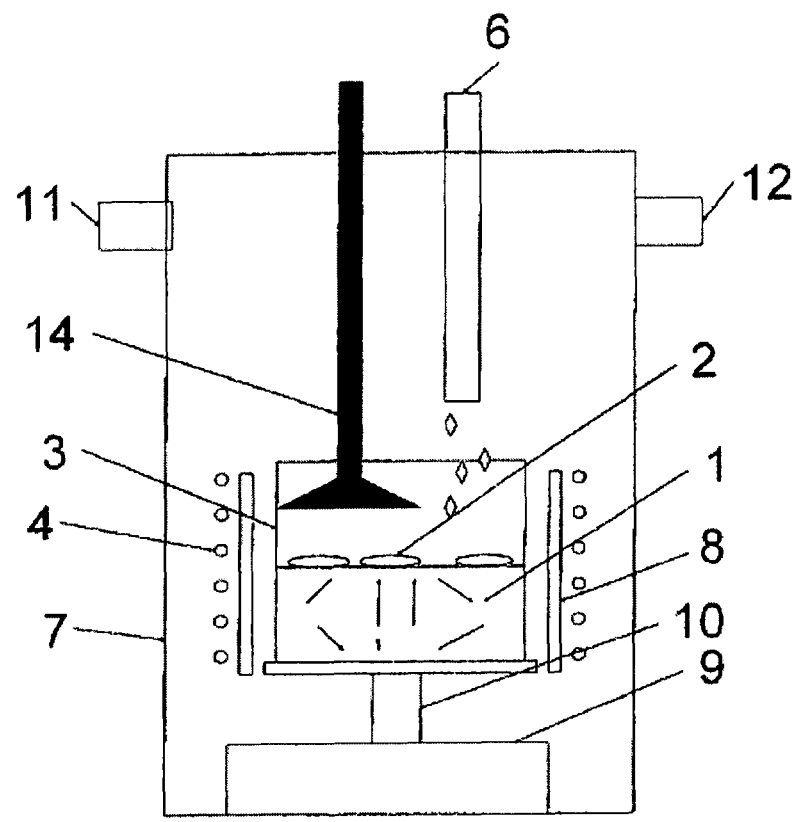
FIG. 6 is a diagrammatic sectional view diagrammatically illustrating still a further example of high-purity silicon production apparatus usable in the invention.

FIG. 6 is a sectional view diagrammatically illustrating still a further example of high-purity silicon production apparatus usable in the invention. In FIG. 6, a powdery or granular salt to be melted is continuously introduced through the feed material charging port 6 and placed on the surface of the molten silicon. Vaporized substances also are continuously discharged from the system through a suction port 14. The other parts are substantially the same as in any of FIGS. 1 to 5.

In FIGS. 1 to 5, a device for trapping the molten salt and reaction products which have been vaporized, such as, for example, a cyclone, filter, or evacuator (each being not shown), is disposed ahead of the gas discharge port 12 or suction port 14.

A high-frequency current of one to tens of kilohertz is usually supplied to the heating coil 4 from a power supply (not shown) to generate an induced current in the graphite crucible 3 or in the molten silicon and thereby heat and melt the contents and inductively stir the contents.

The molten salt trapped by the cyclone usually contains impurities such as boron and phosphorus in a large amount. Consequently, for reclaiming the trapped salt as a starting material, it is preferred to wash the salt with, for example, pure water and dry the salt, or it is preferred to heat the salt to a temperature lower than the melting point thereof or melt the salt, under vacuum. Thus, the trapped salt can be easily purified because compounds containing impurities such as boron and phosphorus generally are water-soluble and have a high vapor pressure.

The operation explained above is repeated according to need. As a result, silicon having a boron content of 1 ppm or less and a phosphorus content of 1 ppm or less can be obtained. As stated above, alkali metals and alkaline earth metals are removed from this silicon according to need. Thus, silicon having a higher purity can be obtained.

The silicon obtained by the process of the invention may have the following impurity concentrations. The concentration of boron (B) therein is usually preferably 1.6 ppm or less, more preferably 1.4 ppm or less, even more preferably 0.38 ppm or less, especially preferably 0.2 ppm or less.

The concentration of phosphorus (P), among the impurity concentrations of the silicon obtained by the process of the invention, is usually preferably 22 ppm or less, more preferably 11 ppm or less, even more preferably 5.4 ppm or less, especially preferably 4 ppm or less.

The concentration of iron (Fe), among the impurity concentrations of the silicon obtained by the process of the invention, is usually preferably 1,300 ppm or less, more preferably 88 ppm or less, even more preferably 37 ppm or less, especially preferably 15 ppm or less.

The concentration of titanium (Ti), among the impurity concentrations of the silicon obtained by the process of the invention, is usually preferably 22 ppm or less, more preferably 15 ppm or less, even more preferably 13 ppm or less, especially preferably 3 ppm or less.

The concentration of aluminum (Al), among the impurity concentrations of the silicon obtained by the process of the invention, is usually preferably 20 ppm or less, more preferably 18 ppm or less, even more preferably 2 ppm or less, especially preferably 1 ppm or less.

The concentration of calcium (Ca), among the impurity concentrations of the silicon obtained by the process of the invention, is usually preferably 22 ppm or less, more preferably 2.1 ppm or less, even more preferably 1.2 ppm or less, especially preferably 15 ppm or less.

The concentrations of impurities in silicon can be determined through analysis with, for example, an ICP-MS (inductively coupled plasma mass spectrometer).

The purity of the silicon obtained by the process of the invention may be further heightened by using other refining method(s) in combination with the process of the invention. The silicon obtained may be processed by a known method to thereby obtain a silicon ingot or silicon wafer for solar cells.

The process of the invention is especially suitable for use as a process for industrially producing high-purity silicon to be used, for example, as a material for producing panels for solar cells.

EXAMPLES

The invention will be explained below in more detail by reference to Examples. However, the invention should not be construed as being limited to the following Examples unless the invention departs from the spirit thereof In the following Examples, the impurity concentrations (ppm) in silicon are values (on weight basis) obtained through analysis with an ICP-MS (inductively coupled plasma mass spectrometer).

The raw-material metallic silicon used in the Examples had the following impurity concentrations: boron (B), 1.6 ppm; phosphorus (P), 30 ppm; iron (Fe), 95 ppm; titanium (Ti), 25 ppm; aluminum (Al), 500 ppm; calcium (Ca), 19 ppm; sodium (Na), below detection limit.

Example 1

The chamber 7 shown in FIG. 1 was filled with an argon gas atmosphere having a pressure of 1 atm. Raw-material metallic silicon to be refined and a salt (NaF) to be melted were placed in the graphite crucible 3 in amounts of 250 g and 50 g, respectively. The silicon and the salt were heated to about 1,550° C. and allowed to stand still for about 2 hours.

Thereafter, the chamber 7 was evacuated to $1.3 \times 10^{-1}$ to $1.3 \times 10^{-3}$ Pa ($10^{-3}$-$10^{-5}$ Torr) to completely vaporize the NaF. The crucible 3 was tilted to pour the residual silicon into the casting mold 9, and the silicon was solidified.

The concentrations of major impurities in the silicon obtained were as follows: boron (B), 1.4 ppm; phosphorus (P), 22 ppm; sodium (Na), 1 ppm. Both the concentrations of boron and phosphorus had decreased, and the concentration of sodium also was sufficiently low.

Example 2

The chamber 7 shown in FIG. 5 was filled with an argon gas atmosphere having a pressure of 1 atm. In the crucible 3 made of graphite were placed 250 g of raw-material metallic silicon to be refined and salts to be melted (NaF+ $BaF_2$: 30 g+30 g). The silicon and the salts were heated to about 1,550° C. and allowed to stand still for about 2 hours.

In this case, the molten salts had a larger specific gravity and, hence, the molten silicon was in the state of floating on the molten salts.

Thereafter, the internal pressure of the chamber was reduced to $1.3 \times 10^3$ Pa (10 Torr). When the system is in this state, a gas is evolved just in the vicinity of the interface between the molten silicon and the molten salts and the evolved gas causes bubbling to satisfactorily stir the interface between the molten silicon and the molten salts. The system in this state was allowed to stand for about two hours and poured into the casting mold 9, in which the molten silicon and the molten salts were allowed to separate from each other and solidify.

The concentrations of major impurities in the silicon obtained were as follows: boron (B), 1.6 ppm; phosphorus (P), 11 ppm. The concentration of phosphorus had decreased to about ⅓ the original concentration thereof in the raw-material metallic silicon, whereas the concentration of boron remained unchanged. The $BaF_2$ used as a molten salt was analyzed and, as a result, boron was detected in an amount of 3.3 ppm. This was thought to be the cause of the unchanged boron concentration.

Example 3

The chamber 7 shown in FIG. 5 was filled with an argon gas atmosphere having a pressure of 1 atm. In the crucible 3 made of graphite were placed 250 g of raw-material metallic silicon to be refined and salts to be melted (NaF+ $BaF_2$+$BaCl_2$: 30 g+30 g+10 g). The silicon and the salts were heated to about 1,550° C. and allowed to stand still for about 2 hours. In this case, as in Example 2, the molten salts had a larger specific gravity and, hence, the molten silicon was in the state of floating on the molten salts.

Thereafter, the internal pressure of the chamber was reduced to $1.3 \times 10^3$ Pa (10 Torr). When the system is in this state, a gas is evolved just in the vicinity of the interface between the silicon and the molten salts and the evolved gas causes bubbling to satisfactorily stir the interface between the molten silicon and the molten salts. The system in this state was allowed to stand for about two hours and poured into the casting mold 9, in which the silicon and the molten salts were allowed to separate from each other and solidify.

The concentrations of major impurities in the silicon obtained were as follows: boron (B), 1.4 ppm; phosphorus (P), 19 ppm; iron (Fe), 37 ppm; titanium (Ti), 15 ppm; aluminum (Al), 18 ppm; calcium (Ca), 22 ppm.

As shown above, the concentration of phosphorus had decreased to about ⅔ the original concentration thereof in the raw-material metallic silicon. With respect to boron, the purity in terms of concentration thereof had increased from 1.6 ppm to 1.4 ppm, although the $BaF_2$ used as a molten salt contained boron in an amount of 3.3 ppm. With respect to aluminum, the purity in terms of concentration thereof had greatly increased from 500 ppm to 18 ppm. With respect to impurities such as iron, titanium, and the like also, the purity in terms of concentration thereof had increased.

Example 4

The chamber 7 shown in FIG. 1 was filled with an argon gas atmosphere having a pressure of 1 atm. Raw-material metallic silicon to be refined and a salt (NaF) to be melted were placed in the graphite crucible 3 in amounts of 250 g and 50 g, respectively. The silicon and the salt were heated to about 1,550° C. Furthermore, argon gas was blown into the liquid phase of silicon to stir the contents for about 1 hour. Thereafter, the chamber 7 was evacuated to $1.3\times10^{-1}$ to $10^{-3}$ Pa ($10^{-3}$-$10^{-5}$ Torr) to completely vaporize the NaF.

Thereafter, 50 g of NaF was introduced again into the crucible to form an interface between the NaF and silicon liquid phases. An argon gas was blown into the silicon liquid phase to stir the contents for about 1 hour, and the chamber was thereafter evacuated in the same manner to completely vaporize the NaF. The crucible was tilted to pour the residual silicon into the casting mold 9, and the silicon was solidified.

The concentrations of major impurities in the silicon obtained were as follows: boron (B), 0.37 ppm; phosphorus (P), 4 ppm; iron (Fe), 88 ppm; titanium (Ti), 22 ppm; aluminum (Al), 20 ppm; calcium (Ca), 21 ppm.

As shown above, the purities in terms of boron concentration and phosphorus concentration greatly increased from 1.6 ppm to 0.37 ppm and from 30 ppm to 4 ppm, respectively.

Example 5

The chamber 7 shown in FIG. 6 was filled with an argon gas atmosphere having a pressure of 1 atm. Raw-material metallic silicon to be refined was placed in the graphite crucible 3 in an amount of 6.1 kg. The silicon was heated to about 1,550° C.

The concentrations of major impurities in the silicon used in this Example were as follows: boron (B), 1.9 ppm; phosphorus (P), 4.6 ppm; iron (Fe), 1,500 ppm; titanium (Ti), 11 ppm; aluminum (Al), 280 ppm; calcium (Ca), 19 ppm.

Furthermore, granular NaF was continuously introduced little by little through the feed material charging port and added to the surface of the molten silicon. The rate of addition was regulated to 1 kg/hr. The impurity-containing NaF which had vaporized from the surface of the silicon was sucked and discharged outside together with argon gas as a carrier gas through a suction tube. A cyclone was disposed ahead of the suction tube, and the vaporized substances were recovered therewith.

About 6 kg of NaF was added in the manner described above. Thereafter, at the time when vaporization of the NaF had substantially ended, the chamber 7 was evacuated to $1.3\times10^{-1}$ to $10^{-3}$ Pa ($10^{-3}$-$10^{-5}$ Torr) to completely vaporize the NaF. Thereafter, the crucible was tilted to pour the residual silicon into the casting mold 9, and the silicon was solidified.

The concentrations of major impurities in the silicon obtained were as follows: boron (B), 0.38 ppm; phosphorus (P), 5.4 ppm; iron (Fe), 1,300 ppm; titanium (Ti), 13 ppm; aluminum (Al), 1 ppm; calcium (Ca), 1.2 ppm.

As shown above, the purities in terms of boron concentration and aluminum concentration greatly increased from 1.9 ppm to 0.38 ppm and from 280 ppm to 1 ppm, respectively.

The concentrations of impurities in the NaF used in this Example were as follows: boron (B), 0.9 ppm; phosphorus (P), 1.2 ppm. In the compounds of NaF which were recovered from the cyclone after the experiment, high-concentration impurities which were 11 ppm boron (B) and 9 ppm phosphorus (P) were detected.

Furthermore, the recovered compounds of NaF were melted at about 1,050° C. in a graphite crucible, treated for about 1 hour in an argon atmosphere of 0.1 atm, and then cooled and solidified. The resultant sample was analyzed for impurities.

As a result, the impurity concentrations had greatly decreased to 0.5 ppm for boron (B) and 0.6 ppm for phosphorus (P). Thus, purified NaF having a high purity which rendered the NaF reusable was able to be obtained.

While the invention has been described in detail and with reference to specific embodiments thereof, it will be apparent to one skilled in the art that various changes and modifications can be made therein without departing from the spirit and scope thereof. This application is based on a Japanese patent application filed on Jul. 3, 2009 (Application No. 2009-159003), the entire contents thereof being incorporated herein by reference.

INDUSTRIAL APPLICABILITY

The process of the invention is especially suitable for use as a process for industrially producing high-purity silicon to be used, for example, as a material for producing panels for solar cells.

DESCRIPTION OF THE REFERENCE NUMERALS

1 Raw-material metallic silicon
2 Molten salt
3 Crucible
4 Coil for induction heating
5 Pipe
6 Feed material charging port
7 Chamber
8 Heat insulator
9 Casting mold
10 Support for crucible
11 Gas introduction port
12 Gas discharge port
13 Stirring plate/concave jig
14 Suction port for gases of molten salt and reaction products

The invention claimed is:

1. A process for producing silicon, which comprises: bringing molten silicon containing an impurity into contact with molten salt in a vessel to react the impurity contained in the molten silicon with the molten salt; vaporizing said impurity and said molten salt; and removing said impurity and said molten salt from said vessel by evacuation,
   wherein said impurity contained in the molten silicon at least includes boron and/or phosphorous and
   wherein the step of vaporizing said impurity and said molten salt; and removing said impurity from said vessel is a step in which a reaction product obtained by reacting the impurity contained in the molten silicon with the molten salt is vaporized and removed
   wherein said molten silicon is reacted with said molten salt until said molten salt is completely vaporized.

2. The process for producing silicon according to claim 1, wherein the step of removing the impurity from the vessel is a step in which the impurity contained in the molten silicon is removed from the vessel together with an inert gas as a carrier gas.

3. The process for producing silicon according to claim 1, wherein a lid for controlling the rate of vaporization of the molten salt or of the reaction product obtained by reacting the impurity contained in the molten silicon with the molten salt is disposed at an inner part or upper part of the vessel.

4. The process for producing silicon according to claim 1, wherein the reaction between the impurity contained in the molten silicon and the molten salt is conducted by forming an interface between the liquid phase of the molten silicon and the liquid phase of the molten salt.

5. The process for producing silicon according to claim 1, wherein the molten salt comprises at least one compound selected from the group consisting of halide salts of alkali metals, halide salts of alkaline earth metals, composite salts containing an alkali metal and a halogen, and composite salts containing an alkaline earth metal and a halogen.

6. The process for producing silicon according to claim 1, wherein the molten salt comprises at least one compound selected from the group consisting of sodium fluoride (NaF), sodium silicofluoride ($Na_2SiF_6$), cryolite ($Na_3AlF_6$), mixtures of sodium fluoride and barium fluoride, and mixtures of sodium fluoride, barium fluoride, and barium chloride.

7. The process for producing silicon according to claim 1, wherein an amount of the molten salt is 5-300% by weight based on the molten silicon.

8. The process for producing silicon according to claim 1, wherein the impurity contained in the molten silicon is reacted with the molten salt while causing the molten silicon to flow by any one of the following methods (i) to (iv):
   (i) a method of blowing an inert gas into the molten silicon,
   (ii) a method of inductively stirring the molten silicon by using a high-frequency induction furnace,
   (iii) a method of mechanically forcing the molten salt of an upper layer into the molten silicon of a lower layer,)
   (iv) a method of stirring the molten silicon by using a rotor.

9. or producing silicon according to claim 1, wherein the molten salt is continuously added to the molten silicon and the step of removing the impurity from the vessel is conducted by a continuous suction removal.

10. The process for producing silicon according to claim 1, wherein after the step of removing the impurity from the vessel, molten salt is added to the molten silicon again and the step is conducted again.

11. The process for producing silicon according to claim 1, wherein substances removed by the step of removing the impurity from the vessel are recovered to purify molten salt, and the purified molten salt is used again as molten salt.

12. The process for producing silicon according to claim 1, wherein said molten silicon is obtained by heating and melting raw-material metal silicon, and said molten salt is added after heating and melting raw-material metal silicon.

13. The process for producing silicon according to claim 12, wherein said raw material metal silicon and said molten salt are heated and melted at a temperature of 1450° C. or higher.

14. The process for producing silicon according to claim 1, wherein said molten salt comprises at least one compound selected from the group consisting of a halide of an alkali metal and a composite salt comprising an alkali metal and a halogen, and an amount of molten salt is 10 to 300% by weight based on said molten silicon.

15. The process for producing silicon according to claim 1, wherein a concentration of boron (B) in said molten silicon containing said impurity is 1.6 ppm or more, and a concentration of boron (B) in a silicon produced is 1.4 ppm or less.

16. The process for producing silicon according to claim 1, wherein a period of contact between said molten silicon and said molten salt is 0.5 hours or longer.

17. The process for producing silicon according to claim 1, wherein said molten silicon has a total concentration of impurity of 10 to 50 ppm.

18. The process for producing silicon according to claim 1, wherein said molten silicon has a total concentration of impurity of 10 to 30 ppm.

* * * * *